US007987401B2

(12) United States Patent
Pandey

(10) Patent No.: US 7,987,401 B2
(45) Date of Patent: Jul. 26, 2011

(54) SYSTEM AND METHOD FOR GENERATING SELF-SYNCHRONIZED LAUNCH OF LAST SHIFT CAPTURE PULSES USING ON-CHIP PHASE LOCKED LOOP FOR AT-SPEED SCAN TESTING

(75) Inventor: Kamlesh Pandey, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 1223 days.

(21) Appl. No.: 11/563,484

(22) Filed: Nov. 27, 2006

(65) Prior Publication Data

US 2008/0126897 A1    May 29, 2008

(51) Int. Cl.
*G01R 31/3177* (2006.01)
*G01R 31/40* (2006.01)
(52) U.S. Cl. ......................................... 714/731; 714/727
(58) Field of Classification Search .................. None
See application file for complete search history.

(56) References Cited

U.S. PATENT DOCUMENTS

| 7,197,725 | B2* | 3/2007 | Takeoka et al. | 714/731 |
| 7,380,189 | B2* | 5/2008 | Konuk | 714/731 |
| 2002/0136064 | A1* | 9/2002 | Yoshiyama | 365/189.05 |
| 2003/0009714 | A1* | 1/2003 | Evans | 714/726 |

* cited by examiner

*Primary Examiner* — Jeffrey A Gaffin
*Assistant Examiner* — Dipakkumar Gandhi
(74) *Attorney, Agent, or Firm* — McAndrews, Held & Malloy, Ltd.

(57) ABSTRACT

Presented herein are system(s) and method(s) for generating self-synchronized launch of last shift capture pulses using on-chip phase locked loop for at-speed scan testing. In one embodiment, there is presented a system for scan testing. The system comprises an ATE clock and a phase lock loop. The ATE clock shifts scan data. The phase lock loop generates capture pulses. The ATE clock or the capture pulses are selected based on an external synchronization signal.

23 Claims, 5 Drawing Sheets

SYSTEM AND METHOD FOR GENERATING SELF-SYNCHRONIZED LAUNCH OF LAST SHIFT CAPTURE PULSES USING ON-CHIP PHASE LOCKED LOOP FOR AT-SPEED SCAN TESTING

RELATED APPLICATIONS

This application is related to patent application Ser. No. 11/563,493, "SYSTEM AND METHOD FOR GENERATING ON-CHIP INDIVIDUAL CLOCK DOMAIN BASED SCAN ENABLE SIGNAL USED FOR LAUNCH OF LAST SHIFT TYPE OF AT-SPEED SCAN TESTING", by Pandey, Nov. 27, 2006, which is incorporated herein by reference for all purposes.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

In very deep sub-micron designs, integrated circuit manufacturers are starting to see more defects that are not caught by traditional stuck-at-fault testing. Defects like high impedance metal, high impedance shorts, cross talk that may not be caught by traditional stuck at scan vectors show up as timing failures that are caught by at-speed testing.

Running a small number of functional vectors can be time consuming and may produce poor coverage. At speed testing can include transition delay testing and path delay testing. Both generate scan patterns that can be scanned in at a slow speed. After a scan vector is scanned in, two or more capture clocks can be applied at full speed and the captured result can be scanned out, usually at slow speed.

In 90 nm and below, at-speed testing is preferable to ensure good-quality. Relying on ATE for at-speed capture pulses does not guarantee good yield for the needed tester accuracy in high speed integrated circuits. It is also possible that because of testing inaccuracy some good parts would fail the at-speed test.

Multiple clock frequency further complicate matters. For example, in a design with one clock running at 125 MHz and another clock running at 200 MHz, two different capture windows are present. Sometimes, the testing will not support all the required capture pulses at the different frequencies.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for generating self-synchronized launch of last shift capture pulses using on-chip phase locked loop for at-speed scan testing, substantially as shown in and/or described in connection with at least one of the figures, as set forth more completely in the claims.

These and other features and advantages of the present invention may be appreciated from a review of the following detailed description of the present invention, along with the accompanying figures in which like reference numerals refer to like parts throughout.

DETAILED DESCRIPTION OF THE INVENTION

Figure 1:
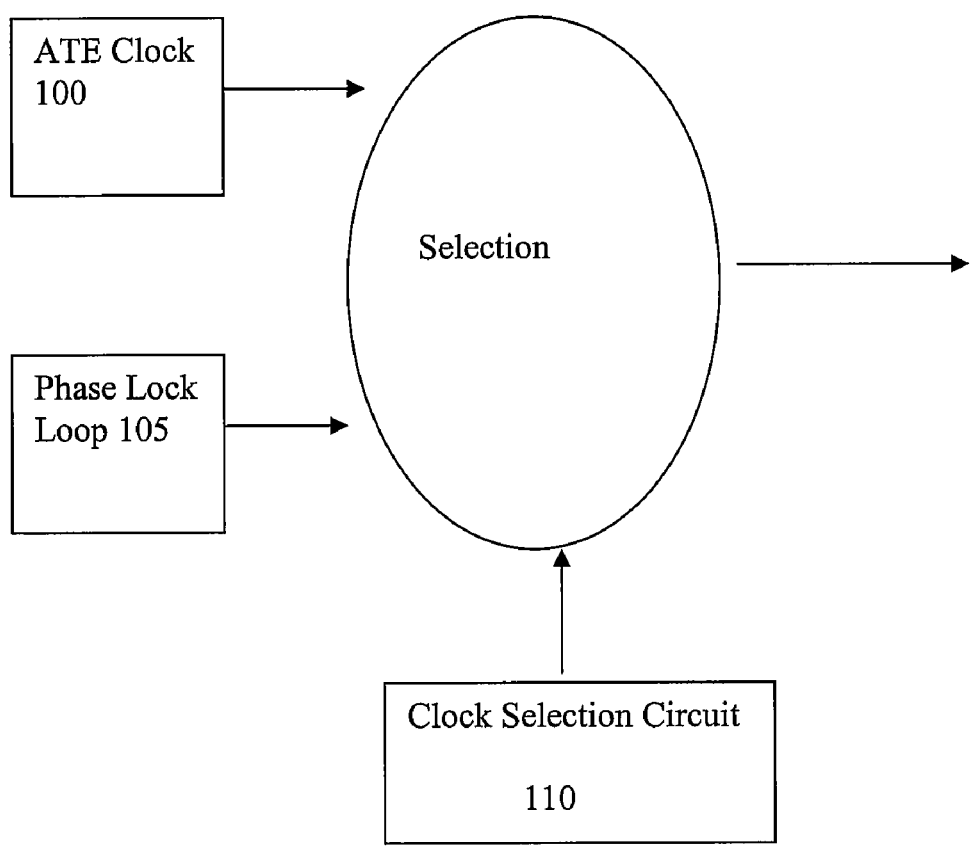
FIG. 1 is a block diagram of an exemplary circuit in accordance with an embodiment of the present invention.

Referring now to FIG. 1, there is illustrated a block diagram for a system for scan testing in accordance with an embodiment of the present invention. The system comprises an Automatic Test Equipment (ATE) clock 100 and a phase lock loop 105. The ATE clock 100 shifts scan data to a device under test.

The ATE clock 100 shifts scan data. The phase lock loop 105 generates capture pulses. Either the ATE clock 100 signal or the capture pulses from the phase lock loop 105 are selected based on a clock select signal generated by clock select logic 110 in response to external trigger signal Certain embodiments can include a multiplexer for selecting between the ATE clock 100 signal and the capture pulses from the phase lock loop 105. The multiplexer can be controlled by a circuit comprising latches and flip flops that receive the external trigger signal.

Figure 2:
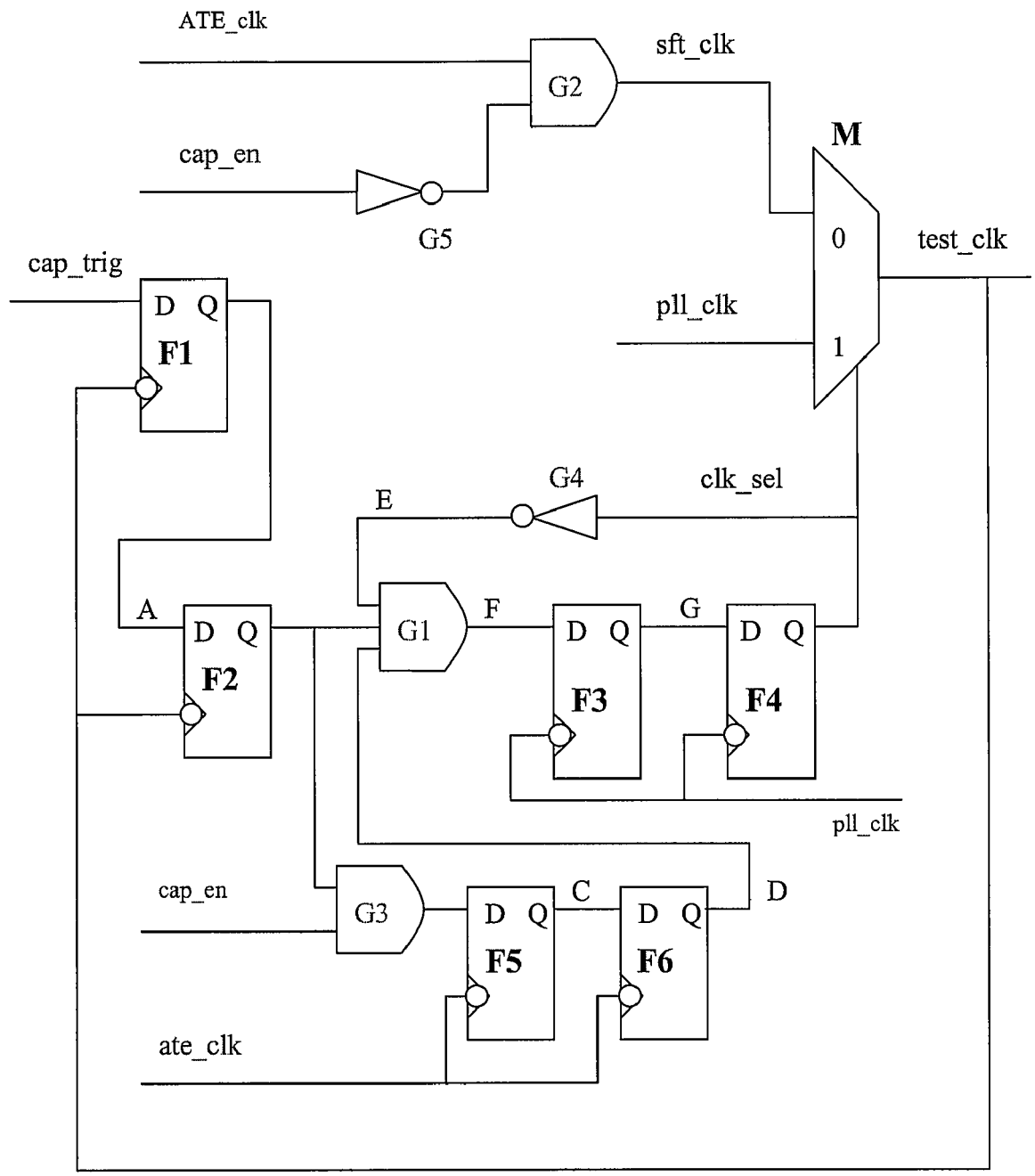
FIG. 2 is a block diagram of another exemplary circuit in accordance with an embodiment of the present invention.

Referring now to FIG. 2, there is illustrated block diagram of an integrated circuit 200 in accordance with an embodiment of the present invention. The integrated circuit 200 comprises a multiplexer M for selecting test_clk between ATE clock 100 shift signal ATE Clock Shift Signal ate_clk and the phase lock loop 105 capture pulses pll_clk on the basis of an external trigger signal external capture trigger signal cap_trig, and provides the selection test_clk to the Device Under Test (DUT).

A circuit comprising negative edge trigger flip flip flops F1-F6, a feedback loop, AND gates G1-G3, and an inverter G4 receives the external capture trigger signal cap_trig and capture enable cap_en signal and provides a clock select signal clk_sel to the multiplexer M.

Flip flop F1 receives a external capture trigger signal cap_trig signal that indicates the start of the capture sequence. In certain embodiments of the present invention, the synchronization signal can be generated externally from the integrated circuit 200. Flip flop F1 is clocked by the output test_clk of multiplexer M. The Flip flop F1 provides an output signal A responsive to receiving the external capture trigger signal cap_trig signal. Output signal A is transmitted to flip flop F2. Flip flop F2 provides the output signal B to an AND gate G1.

AND gate G3 feeds to the Flip flop F5. During last shift cycle and based on capture enable cap_en signal flip flop F5-F6 allow Flip flop F3 and F4 to generate capture pulses. Flip Flop F5 and F6 receives clock from ATE called as ATE Clock Shift Signal ate_clk.

The AND gate G1 forms a portion of a feedback loop comprising flip flop F3 and flip flop F4, and inverter G4. Flip flops F3 and F4 are clocked by clock pulses generated by the phase look loop. The AND gate G1 provides an output that is received by Flip flop F3. Flip flop F3 provides output G to flip flop F4. Flip flop F4 provides output clk_sel to the inverter G4. The output of Flip flop F4 also controls the multiplexer M.

The AND gate G2 forms gating device to ATE Clock Shift Signal ate_clk. The ATE Clock Shift Signal ate_clk is allowed to arrive at multiplexer M when capture enable cap_en signal is LOW.

Depending on the output of flip flop F4, the multiplexer M provides either one of two different clock signals. In certain embodiments, the two different clock signals can correspond to the shift frequency ATE Clock Shift Signal ate_clk or capture frequency phase lock loop capture pulses pll_clk. The multiplexer M provides the selected clock signal test_clk to the functional circuit.

Figure 3:
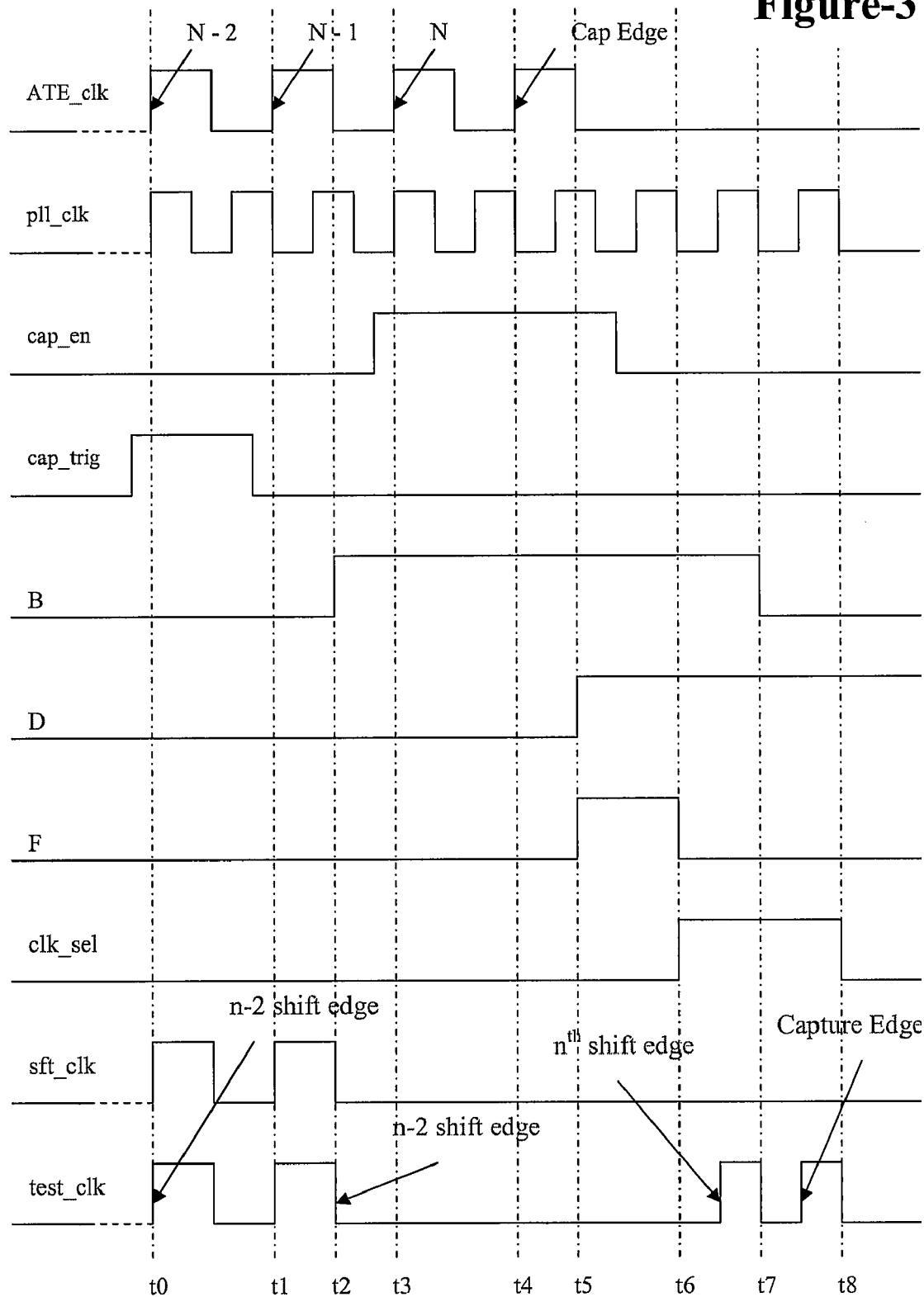
FIG. 3 is a timing diagram for scan testing when the clock domain is enabled to capture in accordance with an embodiment of the present invention.

Referring now to FIG. 3, there is illustrated a timing diagram for scan testing in accordance with an embodiment of the present invention. Initially all the Flip flops are brought in a reset state using external reset signal. Here for the sake of simplicity reset signal for the all Flip flops F1-F6 is not shown. The external capture trigger signal cap_trig and capture enable cap_en signals are asserted low. The multiplexer M initially selects the shift clock ATE Clock Shift Signal ate_clk.

ATE clock is applied till N-3 shift cycles. Here N is total number of shift cycles required to load and unload the scan chains. At time t0, N-$2^{nd}$ cycle starts. At the beginning of N-$2^{nd}$ cycle the external capture trigger signal cap_trig signal is asserted HIGH for one clock cycle. This causes the output A of flip flop F1 to go high on the next negative edge, between t0 and t1. The external capture trigger signal cap_trig signal is asserted LOW before start of N-$1^{st}$ shift cycle.

In response to A, at time t2, the output B of flip flop F2 goes high. If the clock domain is required to capture in the current scan load then capture enable cap_en signal should be asserted HIGH before the beginning of $N^{th}$ shift cycle.

At the negative edge of Nth shift cycle output C of Flip flop F5 goes HIGH. Capture enable cap_en is asserted HIGH. When capture enable cap_en is HIGH the AND gate G2 blocks ATE clock coming at the input of multiplexer M.

The Next ATE clock cycle is known as scan capture cycle. This cycle begins at time t4. In this scheme the $N^{th}$ shift cycle and capture cycle are blocked since they are slow speed cycles. At the negative edge of the ATE capture cycle output D of flip flop F6 goes HIGH. This happens at time t5.

At time t5 all the inputs of the G1 AND gate becomes HIGH. This causes output F of the AND gate G1 go HIGH. This causes, the output of flip flop F3 go high in the next negative edge of phase lock loop capture pulses pll_clk. At time t6, the output clk_sel of flip flop F4 goes high, causing the output E of inverter G4 to go low and causes the multiplexer M to select the phase locked loop clock phase lock loop capture pulses pll_clk as test_clk.

At time t7, the output G of flip flop F3 goes low. At time t8, the output clk_sel of flip flop F4 goes low, causing the multiplexer to select the ATE clock sft_clk and provides the shift clock to the functional circuit.

Figure 4:
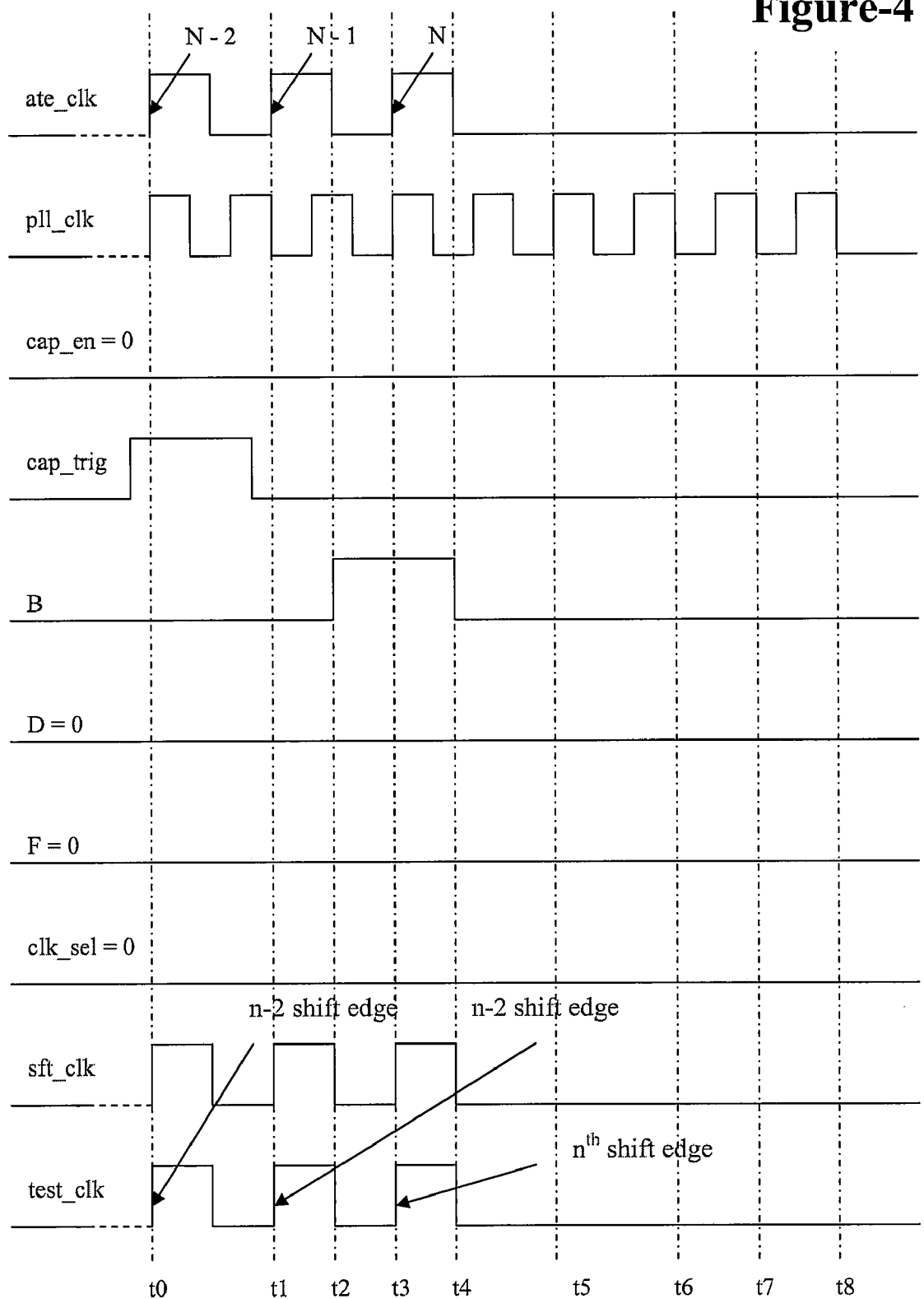
FIG. 4 is a timing diagram for scan testing when the clock domain is not capturing in accordance with an embodiment of the present invention.

FIG. 4 gives the timing diagram in the situation when capture enable cap_en signal is LOW during scan capture phase thus preventing clock domain from capturing data. In this case last ($N^{th}$) shift cycle comes from ATE.

This scheme provides efficient and robust way of switching between slow ATE clock and high speed phase locked loop clock in response to external capture trigger signal.

Figure 5:
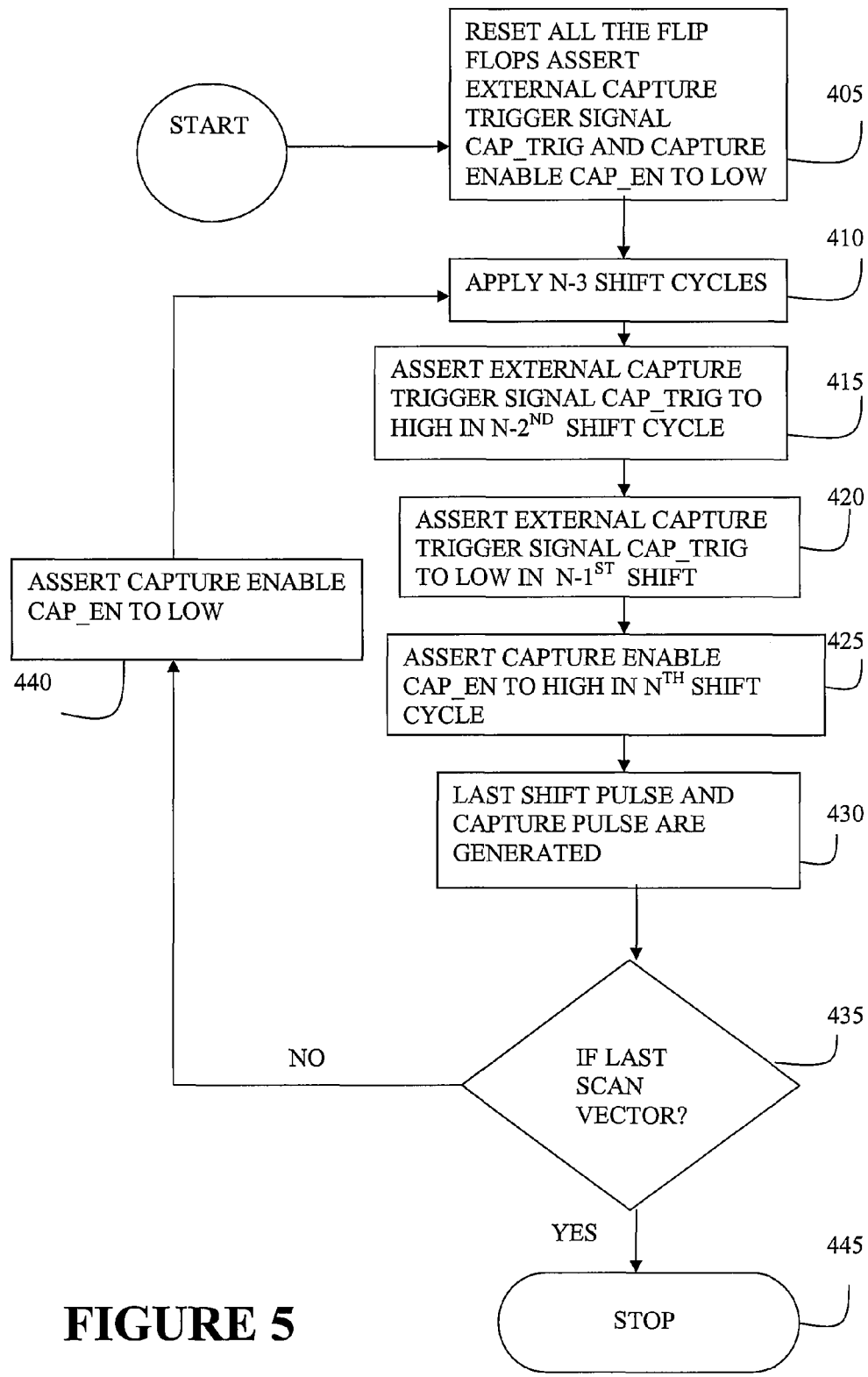
FIG. 5 is a flow diagram for scan testing in accordance with an embodiment of the present invention.

Referring now to FIG. 5, there is illustrated a flow diagram for scan testing in accordance with an embodiment of the present invention. Initially all flip flops are in a reset state and the external capture trigger signal cap_trig and capture enable cap_en signals are asserted low. The multiplexer M initially selects the shift clock sft_clk coming from ATE.

At 410, N-3 shift cycles are applied using ATE Clock Shift Signal ate_clk.

At 415, external capture trigger signal cap_trig signal is asserted HIGH in N-$2^{nd}$ shift cycle.

At 420, external capture trigger signal cap_trig signal is asserted LOW in N-$1^{st}$ shift cycle.

At 425, capture enable cap_en signal is asserted HIGH. This indicates that clock domain should generate last shift and capture pulse using on chip PLL. When capture enable cap_en is HIGH it blocks ATE Clock Shift Signal ate_clk from appearing at multiplexer input.

In response to external capture trigger signal cap_trig and capture enable cap_en, the circuit generates last shift and capture pulse using on chip phase locked loop (PLL) during 430.

At 435 the end of scan test condition is checked. If there are no further scan vectors left to apply then control goes to 445 that indicates end of scan testing. If scan vectors are not finished then go to 440. At 440 the capture enable cap_en is asserted LOW prepare for the next scan vector load.

Certain embodiments provide various advantages. For example, in certain embodiments of the present invention, the conventional scan enable signal may not be required. Certain embodiments can provide accurate capture pulses using on chip phase locked loop or other functional clock source for at-speed scan capture. Certain embodiments of the present invention support launch of last shift type of at-speed scan testing that give very high test coverage compared to present conventional double capture pulse schemes that relies on sequential atpg.

The embodiments described herein may be implemented as a board level product, as a single chip, application specific integrated circuit (ASIC), or with varying levels of the system integrated with other portions of the system as separate components. Alternatively, if the processor is available as an ASIC core or logic block, then the commercially available processor can be implemented as part of an ASIC device wherein certain aspects of the present invention are implemented as firmware.

The degree of integration may primarily be determined by the speed and cost considerations. Because of the sophisticated nature of modern processors, it is possible to utilize a commercially available processor, which may be implemented external to an ASIC implementation.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. A system for scan testing, said system comprising:
   an automatic testing equipment (ATE) clock for shifting scan data;
   a phase lock loop for generating capture pulses;
   a multiplexer for selecting either the ATE clock or the capture pulses, said multiplexer integrated into a device under test; and
   a circuit for controlling the selection of the multiplexer and receiving an external capture trigger signal, wherein a portion of the circuit receives a clock signal from the ATE clock for shifting scan data;
   wherein either the ATE clock or the capture pulses are selected based on an external capture trigger signal.

2. The system of claim 1, further comprising a flip flop for receiving the external capture trigger signal.

3. The system of claim 2, wherein said flip flop is triggered on a falling edge.

4. The system of claim 1, further comprising:
   a plurality of flip-flops for receiving the selection of the multiplexer.

5. The system of claim 1, further comprising another portion of the circuit for controlling the selection of the multiplexer and receiving the external capture trigger receives clock signal from the phase lock loop.

6. The system of claim 1, wherein the circuit comprises a flip flop for directly receiving the external capture trigger signal, wherein said flip flop is clocked by the selection of the multiplexer.

7. A circuit for scan testing, said circuit comprising:
   a multiplexer for selecting one of a plurality of clock signals; and
   a circuit for controlling the multiplexer, said circuit comprising a feedback loop for providing feedback to the circuit; and
   wherein the circuit for controlling the multiplexer receives an external capture trigger signal.

8. The circuit of claim 7, wherein the external capture trigger signal indicates the beginning of a capture cycle.

9. The circuit of claim 7, wherein the plurality of clock signals includes a first clock signal corresponding to a shift pulse and a second clock signal corresponding to a capture pulse.

10. The circuit of claim 9, further comprising:
    an ATE for generating the first clock signal; and
    wherein the feedback loop generates the second clock signal.

11. The circuit of claim 10, wherein the feedback loop comprises a phase lock loop.

12. A circuit for scan testing, said circuit comprising:
    an automatic testing equipment (ATE) clock;
    a phase lock loop; and
    a multiplexer operably coupled to the ATE clock and the phase lock loop, said multiplexer operable to select either ATE clock signals generated by the ATE clock or capture pulses generated by the phase lock loop based on an external capture trigger signal, said multiplexer integrated into a device under test; and
    a circuit for controlling the selection of the multiplexer and receiving the external capture trigger signal, wherein a portion of the circuit receives the clock signal from the ATE clock for shifting scan data.

13. The circuit of claim 12, further comprising a flip flop configured to receive said external capture trigger signal.

14. The circuit of claim 13, wherein said flip flop is triggered at a falling edge.

15. The circuit of claim 12, further comprising:
    a plurality of flip-flops operably coupled to the multiplexer to receive the selection.

16. The circuit of claim 12, further comprising another portion for controlling the selection of the multiplexer which receives clock signal from the phase lock loop.

17. The circuit of claim 12, wherein the circuit comprises a flip flop for directly receiving the external capture trigger signal, wherein said flip flop is clocked by the selection of the multiplexer.

18. A circuit for scan testing, said circuit comprising:
    an integrated circuit to be tested, said integrated circuit comprising:
    a multiplexer configured to select one of a plurality of clock signals, said plurality of signals comprising capture pulses generated by a phase lock loop and signals generated by an Automatic Testing Equipment (ATE) clock; and
    a circuit operably coupled to the multiplexer and configured to receive an external capture trigger signal and to control the multiplexer based on the external capture trigger signal;
    wherein a portion of the circuit receives the signals from the ATE clock for shifting scan data.

19. The circuit of claim 18, wherein the external capture trigger signal indicates the beginning of a capture cycle.

20. The circuit of claim 18, wherein the plurality of clock signals includes a first clock signal corresponding to a shift pulse and a second clock signal corresponding to a capture pulse.

21. The circuit of claim 20, further comprising:
    an ATE operably coupled to the multiplexer, said ATE configured to generate the shift; and
    wherein the feedback loop generates the second clock signal.

22. The circuit of claim 21, wherein the feedback loop comprises a phase lock loop.

23. The circuit of claim 18, further comprising another portion for controlling the selection of the multiplexer which receives clock signal from the phase lock loop.

* * * * *